(12) United States Patent
Mandl et al.

(10) Patent No.: US 11,804,809 B2
(45) Date of Patent: Oct. 31, 2023

(54) AUDIO AMPLIFIER

(71) Applicant: Robert Bosch GmbH, Stuttgart (DE)

(72) Inventors: Markus Mandl, Steinach Agendorf (DE); Gregor Sauer, Straubing (DE); Thomas Stein, Wald (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/698,640

(22) Filed: Mar. 18, 2022

(65) Prior Publication Data

US 2022/0302886 A1    Sep. 22, 2022

(30) Foreign Application Priority Data

Mar. 19, 2021 (DE) .......................... 102021202687.7

(51) Int. Cl.
*H03F 3/217* (2006.01)
*H03F 3/183* (2006.01)

(52) U.S. Cl.
CPC ............ *H03F 3/2173* (2013.01); *H03F 3/183* (2013.01); *H03F 2200/03* (2013.01); *H03F 2200/171* (2013.01); *H03F 2200/351* (2013.01)

(58) Field of Classification Search
CPC .... H03F 3/2173; H03F 3/183; H03F 2200/03; H03F 2200/171; H03F 2200/351; H03F 3/217; H03F 3/187; H03G 3/3005
USPC ........................................ 330/251, 10, 207 A
See application file for complete search history.

(56) References Cited

U.S. PATENT DOCUMENTS

| 11,063,565 B2* | 7/2021 | Lind | H03F 3/185 |
| 11,159,132 B2* | 10/2021 | Coric | H03F 3/68 |
| 2016/0360317 A1* | 12/2016 | Lee | H03F 3/68 |

FOREIGN PATENT DOCUMENTS

DE    102014200964 A1    7/2015

* cited by examiner

*Primary Examiner* — Hieu P Nguyen
(74) *Attorney, Agent, or Firm* — Michael Best & Friedrich LLP

(57) ABSTRACT

In the field of audio amplifiers, the prior art for high output power levels is now to use class D technology. In this technology, audio signals are converted into a pulsed signal. An audio amplifier 1 is proposed, with a modulator section 4 for accepting an input signal and outputting two intermediate signals, wherein the modulator section 4 is designed to generate the intermediate signals by modulating the input signal, with an amplifier section 8 for accepting the two intermediate signals and outputting two amplified signals, wherein the amplifier section 8 is designed to generate the two amplified signals by amplifying the two intermediate signals, the amplifier section having two power stages 11;12, with an end section 21 for accepting the two amplified signals and for outputting an output signal for a loudspeaker device 2, wherein the audio amplifier 1 can be switched between parallel operation and bridge operation.

18 Claims, 4 Drawing Sheets

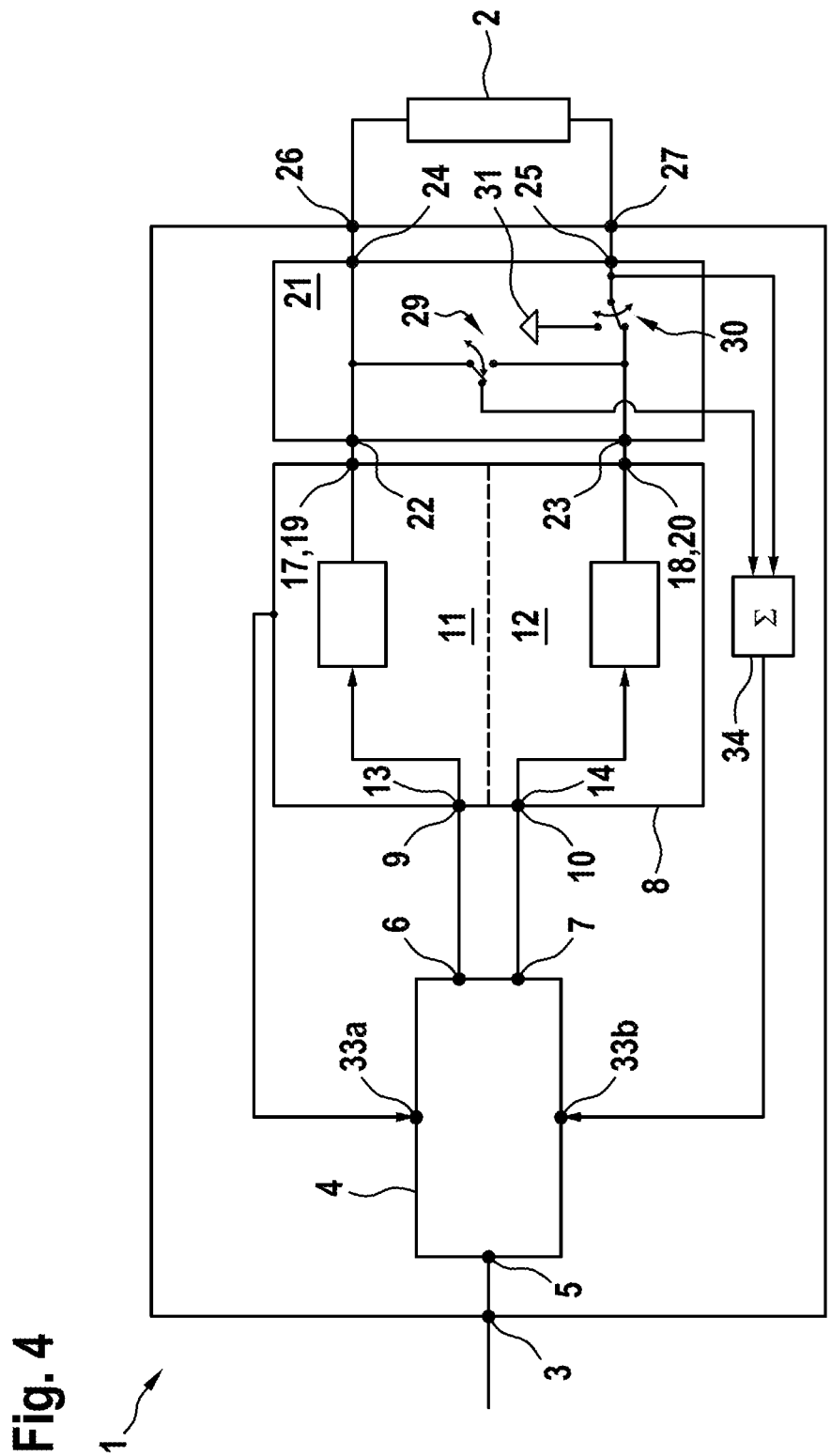

AUDIO AMPLIFIER

BACKGROUND OF THE INVENTION

The invention relates to an audio amplifier.

In the field of audio amplifiers, it is known to use class D technology for high power densities. Patent DE 10 2014 200 964 A1 discloses such an amplifier with class D technology. In this technology, audio signals are converted into a pulsed signal. This conversion is carried out by the so-called "class D modulator", which is usually designed as a pulse-width modulator. This allows the amplifier to be driven in the switched mode, which means the switching elements, usually transistors, are either maximally conducting or maximally blocking and can thus only occupy two states. In contrast to conventional class AB amplifiers, these two operating ranges have little power dissipation. This means that the great advantage of this technology is its high efficiency.

SUMMARY OF THE INVENTION

The subject matter of the invention relates to an audio amplifier.

The audio amplifier is designed in particular as a class D amplifier. The class D amplifier is also referred to as a switching amplifier, digital output stage, or digital amplifier. The audio amplifier is used to amplify an input signal, in particular an audio signal, into an output signal in order to operate a loudspeaker device. Optionally, the loudspeaker device forms part of the audio amplifier.

The audio amplifier has a modulator section, wherein the modulator section accepts the input signal, processes the signal and outputs at least or exactly two intermediate signals. In particular, the modulator section consists of circuitry designed to modulate the input signal, in particular to perform pulse-width modulation (PWM). The intermediate signals are formed in particular as a sequence of rectangular pulses.

In the signal path, the intermediate signals are subsequently routed to an amplifier section as a component of the audio amplifier, wherein the amplifier section accepts the intermediate signals, amplifies them and outputs two amplified signals. The amplifier section is operated in particular in a switched mode. Preferably, the amplifier section has switching elements, in particular transistors, which are driven either in a maximally conducting or a maximally insulating mode and can therefore only occupy two states.

The amplifier section has two power stages, wherein each of the power stages preferably has at least or exactly two switching elements to implement the switched-mode operation.

The audio amplifier has an end section for accepting the two amplified signals and outputting at least one output signal for the loudspeaker device. In particular, the output signal is generated on the basis of the amplified signals.

Optionally, each power stage has reconstruction filters and/or low pass filters to filter the respective amplified signal, in particular to produce a continuous voltage waveform corresponding to the input signal.

As part of the invention, the audio amplifier always has two power stages which can be operated either in a bridge configuration or in parallel depending on the operating mode, and in both cases the output signal is output at the same terminals. For high impedances, double the voltage of a single power stage can be achieved at the output by using bridge operation. For low impedances, double the current of a single power stage can be provided by using parallel operation. This allows the audio amplifier to be better adapted to the application and makes better use of the power components. In other words, less expensive power components can be used compared to the prior art.

In addition, it is proposed that the modulator section has exactly one modulator device for modulating the input signal. In particular, the modulator section has only one comparator for comparing the input signal with a reference signal, in particular a triangle-wave signal.

It is a consideration of the invention that the reduction to one modulator device allows cost and space savings to be achieved in the implementation of the audio amplifier, since a corresponding printed circuit board or module only needs to accommodate the electronics of one modulator device for two power stages. The modulator device preferably consists of a plurality of matched operational amplifier circuits and various feedback signals. Accordingly, the costs and space requirements on the printed circuit board are not insignificant and are halved.

In addition, the number of audio inputs for the input signal is reduced, since the modulator device itself processes the input signal for the two power stages. Therefore, only one audio input is needed for the power stages. This brings additional space and cost savings on the printed circuit board or module. Each audio input preferably requires an "input stage", which is designed as an electronic operational amplifier circuit. Also, it is now increasingly common to process digital audio signals as input signals in such audio amplifiers. In order to be able to amplify these digital signals, they must normally first be converted into an analog signal using DAC's (digital-to-analog converters), which preferably form part of the audio amplifier. This means that one input stage and/or an additional DAC can optionally be saved. Preferably, the audio amplifier has exactly one, in particular single-channel, input stage and/or exactly one single-channel DAC for the input signal.

It is preferably provided that the end section has a first and a second output terminal for outputting the output signal. In parallel operation, the first output terminal is supplied with the amplified signal, in particular a common amplified signal from both power stages, and the second output terminal is conductively connected to ground. In bridge operation, the first output terminal is supplied with a first amplified signal of the first power stage and the second output terminal is supplied with a second amplified signal of the second power stage. In parallel operation the loudspeaker device can be operated with a higher current, in bridge operation with a higher voltage.

In parallel operation in particular, there are advantages in connection with the implementation of exactly one modulator device as this ensures the current distribution in the two power stages. Since the intermediate signals are only generated by one common modulator device and are the same for both power stages in parallel operation, these power stages therefore switch very precisely relative to each other. This is because in parallel operation, the switching of both power stages should be as identical as possible in order to ensure equal currents at their power stage outputs. If these currents were of different size, a not insignificant transverse current would flow from one power stage to the other. This transverse current is not a useful current, but only generates power dissipation within the audio amplifier. In a parallel operation known from the prior art with two independent class D modulators, it is usually not possible to guarantee a precisely coordinated switching of the power stages as these readily generate different PWM signals as a result of tolerances. For this reason, a complex control circuit is required in practice. This circuit matches the two class D modulators to each other for parallel operation in order to obtain equal currents again at the power stages. With the design according to the invention, such a control circuit is no longer necessary.

In a preferred embodiment of the invention, the modulator section is designed to transmit two identical and thus in-phase intermediate signals to the amplifier section in parallel operation. In contrast, in bridge operation the modulator section is designed to transmit a first intermediate signal to the first amplifier input and a second intermediate signal to the second amplifier input, wherein the first intermediate signal is in antiphase and/or inverted with respect to the second intermediate signal.

In a preferred development of the invention, feedback is applied from the amplifier section to the modulator section. This feedback from the amplifier section consists of one and/or more feedback signals. The amplified signals from the two power stages are among the signals used to provide the feedback.

In parallel operation, it is preferred that the common amplified signal, i.e. the output signals of the power stages connected together, are fed back.

In a preferred development of the invention, for the bridge operation, in addition to the feedback signals from the amplifier section a summation signal of the amplification signals of the two power stages is fed back. After the amplified signals have been inverted relative to each other in bridge operation, in terms of amplitude the summation corresponds to a difference. The differences between the two power stages, which represent an unwanted deviation from the ideal state (summation signal=0), are thus fed back. This feedback into the modulator is used to balance out the differences and to remove them from the output signal extracted between the two output terminals.

BRIEF DESCRIPTION OF THE DRAWINGS

Further features, advantages and effects of the invention are derived from the following description of a preferred exemplary embodiment of the invention and from the accompanying drawings. In the drawings:

FIG. 4 shows a schematic representation of the audio amplifier in the previous figures with a representation of the feedback.

DETAILED DESCRIPTION

The starting point of the invention is the consideration that audio amplifiers can be operated with either low and/or high impedances (loudspeakers). In the ideal case, the amplifier would be able to be used for both application cases. Low impedances are usually found in public address systems used for temporary events, such as concerts or theater productions. High impedances are usually found in fixed installations of public address systems (e.g. 70V/100V lines in stadiums, airports). Every loudspeaker, whether it has low or high impedance, requires power to be operated. At low impedance more current is needed, and at high impedance more voltage is needed at the output of the audio amplifier to achieve the same output power at the loudspeaker. If a power stage of the amplifier is to be able to operate both load types (low and high impedances), its output must provide a high current for the one case and a high voltage for the other case. This design would lead to over-dimensioning for the other case, i.e. more current than necessary for high impedances and more voltage than necessary for low impedances. In this example, the power stage of the amplifier would be over-dimensioned in terms of power. The invention described below solves this in an advantageous way.

Figure 1:
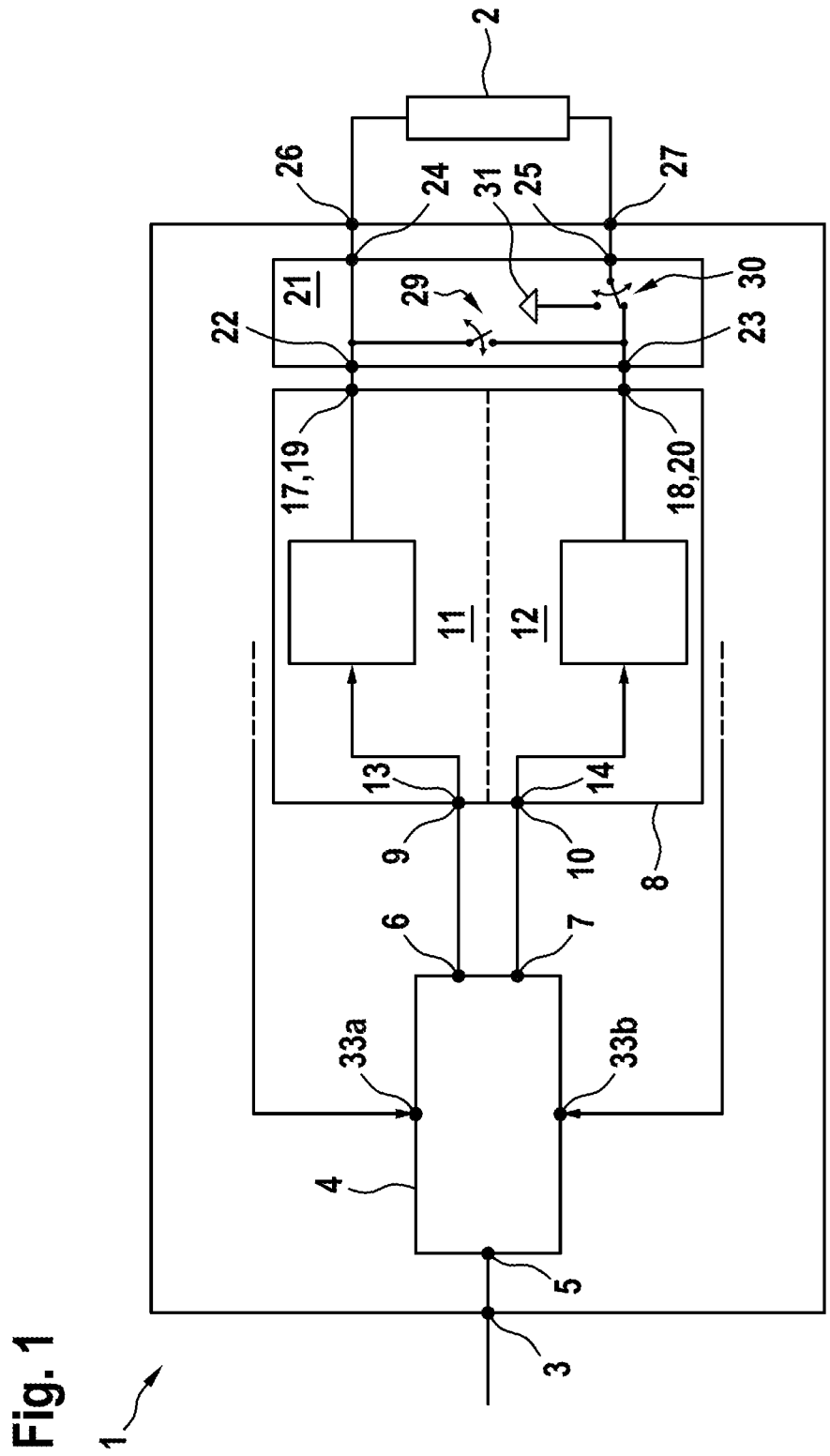
FIG. 1 shows a schematic representation of an audio amplifier as an exemplary embodiment of the invention.

FIG. 1 shows a schematic representation of an audio amplifier 1, wherein the audio amplifier 1 is designed as a class D amplifier. The function of the audio amplifier 1 is to accept an input signal, amplify it, and output it to a loudspeaker device 2. The loudspeaker device 2 is shown schematically as a load.

The input signal is fed to the audio amplifier 1 via an audio input 3. The audio input 3 is designed as a single signal input, in particular single-channel. In particular, the audio signal is implemented as an analog signal.

The audio amplifier 1 has a modulator section 4, wherein a modulator input 5 is connected to the audio input 3 for signal transmission. Optionally, an input stage, in particular a single-channel input stage, is also provided between audio input 3 and the modulator input 5. In alternative embodiments, the input signal is formed as a digital signal, with a digital-to-analog converter (DAC) being connected between the audio input 3 and the modulator input 5. The modulator section 4 has two modulator outputs 6, 7 for outputting two intermediate signals.

The audio amplifier 1 has an amplifier section 8, with the amplifier section 8 having two amplifier inputs 9, 10. The amplifier inputs 9, 10 are connected to the modulator outputs 6, 7 for signal transmission via cables, with the first amplifier input 9 being connected to the first modulator output 6 and the second amplifier input 10 connected to the second modulator output 7.

The amplifier section 8 has a first and a second power stage 11, 12, wherein a first power stage input 13 is connected for signal transmission to the first amplifier input 9 and a second power stage input 14 is connected for signal transmission to the second amplifier input 10. A first power stage output 17 of the first power stage 11 is connected for signal transmission to a first amplifier output 19, a second power stage output 18 of the second power stage 12 to a second amplifier output 20.

The audio amplifier 1 has an end section 21, with the end section 21 having two end inputs 22, 23 and two end outputs 24, 25. The first end input 22 is connected to the first amplifier output 19, the second end input 23 is connected to the second amplifier output 20. The first end output 24 is connected for signal transmission to the first output terminal 26, the second end output 25 is connected to the second output terminal 27.

From a functional point of view, an analog or digital audio signal as the input signal is turned into a sequence of pulses as the intermediate signals in the modulator section 4 by means of a suitable method, for example by pulse-width modulation (PWM). The intermediate signals are amplified in a switched-mode operation in the amplifier section 8 to form the amplified signals.

The audio amplifier 1 can be operated in a parallel operating mode and in a bridge operating mode. Switching between the two operating modes can be carried out by switching over in the audio amplifier 1, for example.

Figure 2:
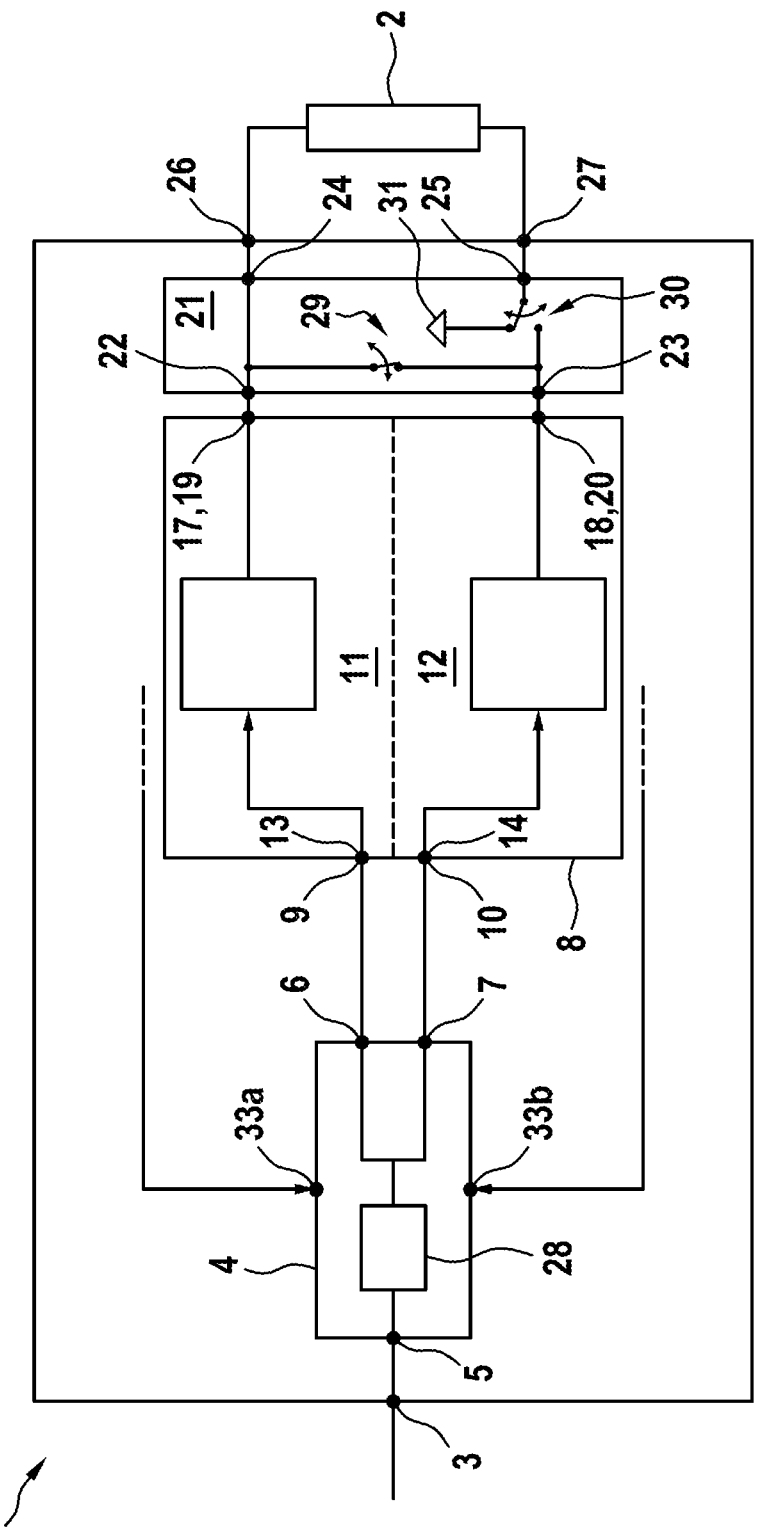
FIG. 2 shows the schematic representation of the audio amplifier in FIG. 1 in a parallel operation.
Figure 3:
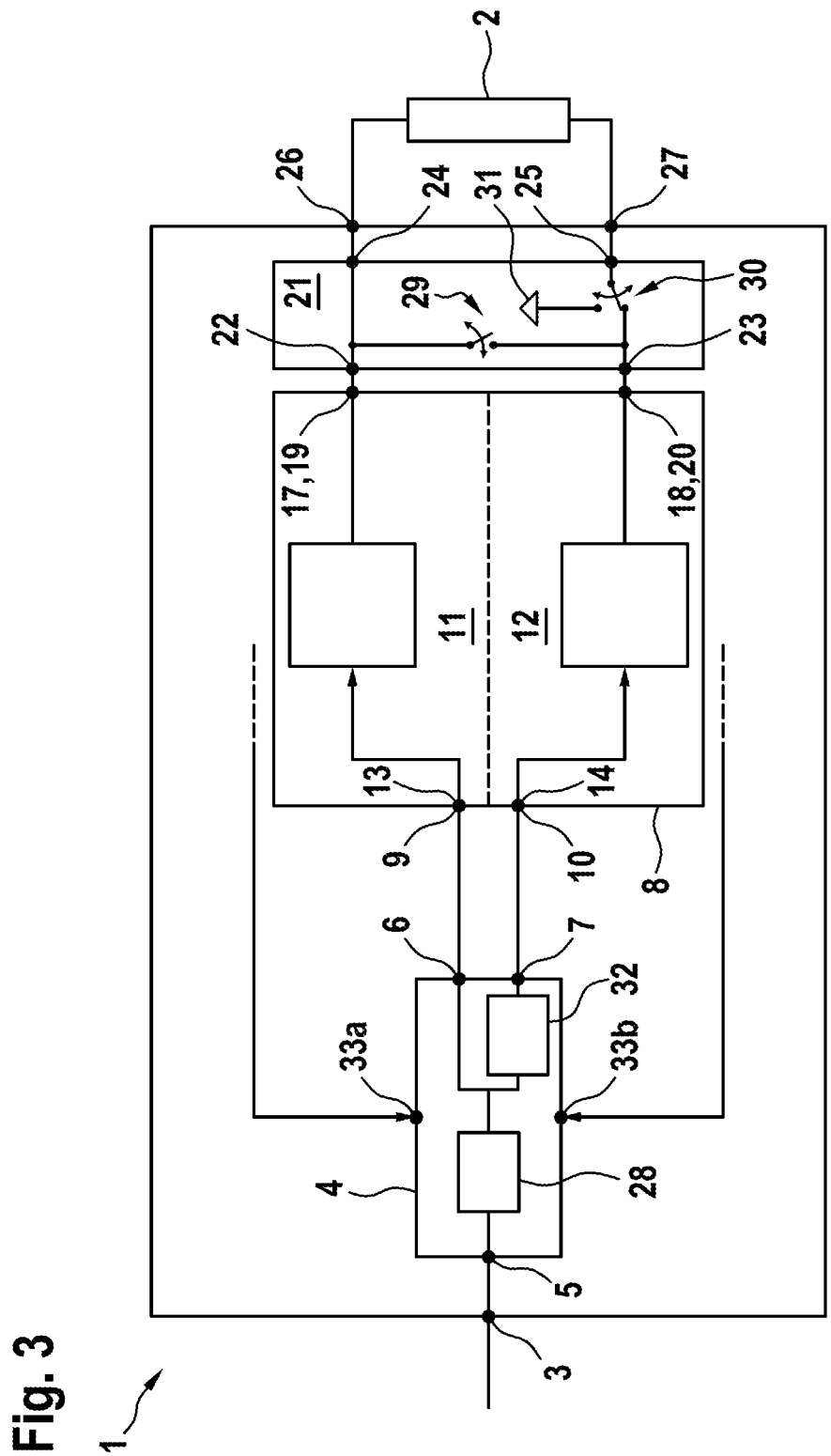
FIG. 3 shows the schematic representation of the audio amplifier in FIG. 1 in a bridge operation.

FIG. 2 shows the audio amplifier 1 from FIG. 1 in the parallel operating mode, FIG. 3 shows the audio amplifier 1 from FIG. 1 in the bridge operating mode. With the explanation of the operating modes, additional components of the audio amplifier 1 will be introduced which are also present in the audio amplifier 1 in FIG. 1 but are not represented graphically. The audio amplifier 1 can be switched between the two operating modes.

The modulator section 4 has exactly one modulator device 28, wherein this is connected for signal transmission to the modulator input 5 on the input side.

In the "parallel operation" operating state, the modulator device 28 is connected to the modulator outputs 6, 7 on the output side so that two identical intermediate signals are present at these and thus at the amplifier inputs 9, 10 and at the power stage inputs 13, 14.

The end section 21 has a connection switching device 29, wherein the connection switching device 29 is designed as follows: in a first switching state (bridge operation), the end inputs 22, 23 are disconnected from each other. In a second switching state (parallel operation), the end inputs 22, 23 are connected to each other conductively and/or for signal transmission.

The end section 21 also has a changeover switching device 30, wherein the changeover switching device 30 is designed to connect the end output 25 to ground 31 in a second (parallel operation) switching state. In a first switching state (bridge operation), the second end output 25 is connected to the second end input 23 conductively and/or for signal transmission.

In the "parallel operation" operating mode, the output signal has a higher current and lower voltage compared to the "bridge operation" operating mode and/or is intended for use with a loudspeaker device 2 with low impedance.

In the "bridge operation" operating state, an inverting device 32 is connected between one of the connections between the modulator device 28 and the modulator outputs 6, 7. The inverting device 32 inverts one of the intermediate signals so that the same intermediate signal is present at the modulator output 6 as at the output of the modulator device 28. On the other hand, the inverted and/or antiphase intermediate signal is present at the modulator output 7.

The connection device 29 is open, but the changeover switching device 30 is closed so that the second loudspeaker terminal 27 is conductively connected to the second power stage output 18. In the "bridge operation" operating mode, the output signal has a higher voltage and lower current compared to the "parallel operation" mode and/or is intended for use with a loudspeaker device 2 with high impedance.

The modulator section 4 has two feedback inputs 33 *a, b*. The feedback inputs 33 *a, b* are connected to each other in the modulator section 4. The connection can also be made before the modulator section 4. As a result, a common feedback signal is formed which acts on the modulator device 28 or at least on the input signal. Preferably, the feedback signal is inverted with respect to the input signal.

FIG. 4 shows the audio amplifier 1 in a schematic block diagram.

In bridge operation, the feedback signal consisting of one and/or more feedback signals from the amplifier section 8 is fed back to the feedback input 33*a*. The diagram also shows that in the switch position for the bridge operation, the connection switching device 29 passes the amplified signal from the first power stage 11 to a summation device 34. The changeover switching device 30 is unchanged, wherein the amplified signal from the second power stage 12 is also passed to the summation device 34. Thus, both amplified signals are present at the summation device 34, although in the bridge operating mode these are inverted with respect to each other. At the operating point, the summation device outputs the value 0. Near to the operating point, a signal is output that contains signal information from both power stages 11,12. This signal information from the summation device is fed back to the feedback input 33*b*.

The invention claimed is:

1. An audio amplifier (1), comprising:
a modulator section (4), for accepting an input signal and outputting two intermediate signals, wherein the modulator section (4) is configured to generate the intermediate signals by modulating the input signal,
an amplifier section (8) for accepting the two intermediate signals and outputting two amplified signals, wherein the amplifier section (8) is configured to generate the two amplified signals by amplifying the two intermediate signals, the amplifier section having two power stages (11;12), and
an end section (21) for accepting the two amplified signals and outputting an output signal for a loudspeaker device (2),
wherein
the audio amplifier (1) is configured to switch between parallel operation and bridge operation, and
the audio amplifier is configured such that in parallel operation the feedback consisting of one or more feedback signals from the amplifier section (8) is fed back into the modulator section (4).

2. The audio amplifier (1) according to claim 1, wherein the modulator section (4) has only one modulator device (28) for modulating the input signal.

3. The audio amplifier (1) according to claim 1, wherein the end section (21) has a first and a second output terminal for outputting the output signal, wherein in parallel operation, the first output terminal is supplied with a common signal formed by the first amplified signal and the second amplified signal, and the second output terminal is connected to ground (31), and in bridge operation, the first output terminal is supplied with a first amplified signal and the second output terminal with a second amplified signal.

4. The audio amplifier (1) according to claim 1, wherein in parallel operation the end section connects the two power stages (11;12) to the first output terminal and in bridge operation connects the first output terminal to the first power stage (11) and the second output terminal to the second power stage (12).

5. The audio amplifier (1) according to claim 1, wherein in parallel operation the modulator section (4) is configured to output two identical and thus in-phase intermediate signals to the amplifier section (8) and in bridge operation to output a first intermediate signal and a second intermediate signal to the amplifier section (8), wherein the first intermediate signal is in antiphase and/or inverted with respect to the second intermediate signal.

6. The audio amplifier (1) according to claim 1, wherein the modulator section (4) has an inverting device (32) for inverting one of the intermediate signals.

7. The audio amplifier (1) according to claim 1, wherein in parallel operation two identical and thus in-phase intermediate signals are applied to both power stages (11;12), and in bridge operation the first intermediate signal is applied to the first power stage (11) and the second intermediate signal is applied to the second power stage (12), one of the intermediate signals being inverted.

8. The audio amplifier (1) according to claim 1, wherein the one or more feedback signals are negative feedback signals.

9. The audio amplifier (1) according to claim 1, wherein said amplifier is configured as a class D amplifier.

10. An audio amplifier (1) comprising:
- a modulator section (4), for accepting an input signal and outputting two intermediate signals, wherein the modulator section (4) is configured to generate the intermediate signals by modulating the input signal,
- an amplifier section (8) for accepting the two intermediate signals and outputting two amplified signals, wherein the amplifier section (8) is configured to generate the two amplified signals by amplifying the two intermediate signals, the amplifier section having two power stages (11;12), and
- an end section (21) for accepting the two amplified signals and outputting an output signal for a loudspeaker device (2), wherein the audio amplifier (1) is configured to switch between parallel operation and bridge operation, and the audio amplifier is configured such that in bridge operation feedback consisting of one or more feedback signals from the amplifier section (8) supplemented by a summation of the amplified signals that is fed back into the modulator section (4) and/or to the input signal.

11. The audio amplifier (1) according to claim 10, wherein said amplifier is configured as a class D amplifier.

12. The audio amplifier (1) according to claim 10, wherein the modulator section (4) has only one modulator device (28) for modulating the input signal.

13. The audio amplifier (9) according to claim 10, wherein the end section (21) has a first and a second output terminal for outputting the output signal, wherein in parallel operation, the first output terminal is supplied with a common signal formed by the first amplified signal and the second amplified signal, and the second output terminal is connected to ground (31), and in bridge operation, the first output terminal is supplied with a first amplified signal and the second output terminal with a second amplified signal.

14. The audio amplifier (1) according to claim 10, wherein in parallel operation the end section connects the two power stages (11;12) to the first output terminal and in bridge operation connects the first output terminal to the first power stage (11) and the second output terminal to the second power stage (12).

15. The audio amplifier (1) according to claim 10, wherein in parallel operation the modulator section (4) is configured to output two identical and thus in-phase intermediate signals to the amplifier section (8) and in bridge operation to output a first intermediate signal and a second intermediate signal to the amplifier section (8), wherein the first intermediate signal is in antiphase and/or inverted with respect to the second intermediate signal.

16. The audio amplifier (1) according to claim 10, wherein the modulator section (4) has an inverting device (32) for inverting one of the intermediate signals.

17. The audio amplifier (1) according to claim 10, wherein the amplified signals that are fed back have amplitudes that correspond to a difference when summed.

18. The audio amplifier (1) according to claim 10, wherein the one or more feedback signals are negative feedback signals.

* * * * *